United States Patent
Stern et al.

[11] Patent Number: 6,130,583
[45] Date of Patent: Oct. 10, 2000

[54] ATOMIC FREQUENCY STANDARD USING DIGITAL PROCESSING IN ITS FREQUENCY LOCK LOOP

[75] Inventors: Avinoam Stern, Jerusalem; Benny Levi, Ma'ale Edomim; Avigdor Saksonov, Efraim, all of Israel

[73] Assignee: Accubeat LTD, Jerusalem, Israel

[21] Appl. No.: 09/145,082

[22] Filed: Sep. 1, 1998

[30] Foreign Application Priority Data

Sep. 1, 1997 [IL] Israel .......................................... 121671

[51] Int. Cl.[7] ........................................................ H03L 7/26
[52] U.S. Cl. ................................................ 331/3; 331/94.1
[58] Field of Search ........................................ 331/3, 94.1

[56] References Cited

U.S. PATENT DOCUMENTS 5,606,291  2/1997  Verbanets ...................................... 331/3
5,852,386  12/1998  Chantry et al. ............................... 331/3

*Primary Examiner*—Siegfried H. Grimm
*Attorney, Agent, or Firm*—Darby & Darby

[57] ABSTRACT

A passive atomic frequency standard such as a Rubidium Frequency Standard or a Cesium Frequency Standard, using a microprocessor or equivalent circuit as part of its Frequency Locked Loop. The microprocessor phase modulates (pm) the RF signal which is introduced into the Atomic Resonator, and demodulates the output signal. The modulation and demodulation are performed by frequency hopping or spread spectrum techniques. Secondly, the microprocessor samples and integrates the error signal from the atomic resonator (Physics Package or Atomic Tube) with a sampled weighted-sum technique and thus better filters the noise, improves the Signal to Noise Ratio, rejects large noise like spikes, etc. Thirdly, the microprocessor saves the last control voltage of the Voltage Controlled Oscillator (VCO) to ease the start-up of the device as well as to keep the VCO at the last frequency in case the atomic resonator fails to function.

5 Claims, 1 Drawing Sheet

ATOMIC FREQUENCY STANDARD USING DIGITAL PROCESSING IN ITS FREQUENCY LOCK LOOP

FIELD OF THE INVENTION

The present invention relates to atomic frequency standards and in particular to atomic frequency standards using digital processing in frequency lock loop.

BACKGROUND OF THE INVENTION

A known Frequency Lock Loop (FLL) of a passive atomic frequency standard is shown in FIG. 1. It comprises a Voltage Controlled Oscillator (1), usually a Crystal Oscillator, which outputs an RF signal at 10 MHz. The RF signal is modulated by a modulator (7) at low frequency, and is multiplied and synthesized by a multiplier/synthesizer (2) which multiplies and synthesizes the said RF signal to the Microwave range, to produce a signal at 6.84 Hz (for a Rubidium Standard) or of 9.26 Hz for a Cesium Standard. The said Microwave signal is injected into an Atomic Resonator (3) which may be a Rubidium Physics Package working on a principle of an optical pumping, or a Cesium Beam Tube.

The Atomic Resonator (3) outputs an error signal which is being amplified by the Preamplifier (4) followed by a demodulator (5) which demodulates the error signal and an Integrator (6) which integrates the signal and controls the VCO. This is a common FLL scheme for Atomic Clocks (Ref. 1).

SUMMARY OF THE INVENTION

The present invention relates to an atomic frequency standard comprising an FLL circuit containing a microprocessor or equivalent intelligent circuit, adapted to modulate the RF input to an atomic resonator and to demodulate an error signal by means of frequency hopping or by a spread spectrum technique. Preferably the microprocessor is adapted to sample and to integrate the error signal from the atomic resonator, utilizing a weighted average to improve the signal to noise ratio and to reject disturbances.

The invention further relates to a method of operating a passive atomic frequency standard which comprises a microprocessor as part of the frequency lock loop, modulating the RF signal introduced into the atomic resonator and demodulating the output signal by frequency hopping or by a spread spectrum technique. Preferably the error signal is integrated by a microprocessor using a weighed sum technique, thus filtering out noise and improving the signal-to-noise ratio and rejecting disturbances. It also relates to a method where the last control voltage of the voltage controlled oscillator is saved in order to facilitate the start up of the device and in order to keep the VCO at the last frequency in case of atomic resonator failure.

BRIEF DESCRIPTION OF THE FIGURES

The present invention will be understood and appreciated more fully from the following detailed description taken in conjunction with the drawings in which.

DETAILED DESCRIPTION OF THE INVENTION

Figure 1:
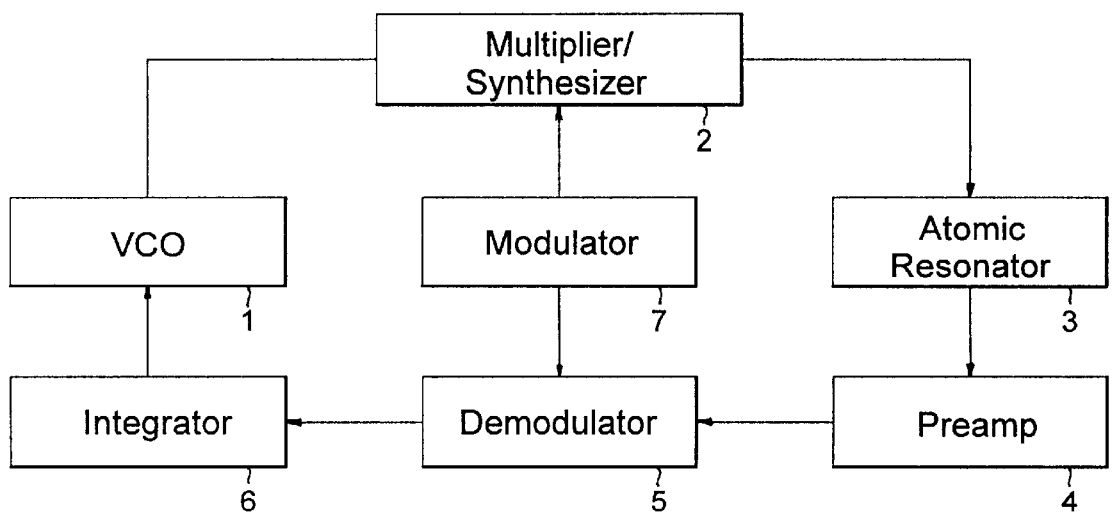
FIG. 1 is a block diagram illustration of a prior art Frequency Lock loop (FLL) of a passive atomic frequency standard.
Figure 2:
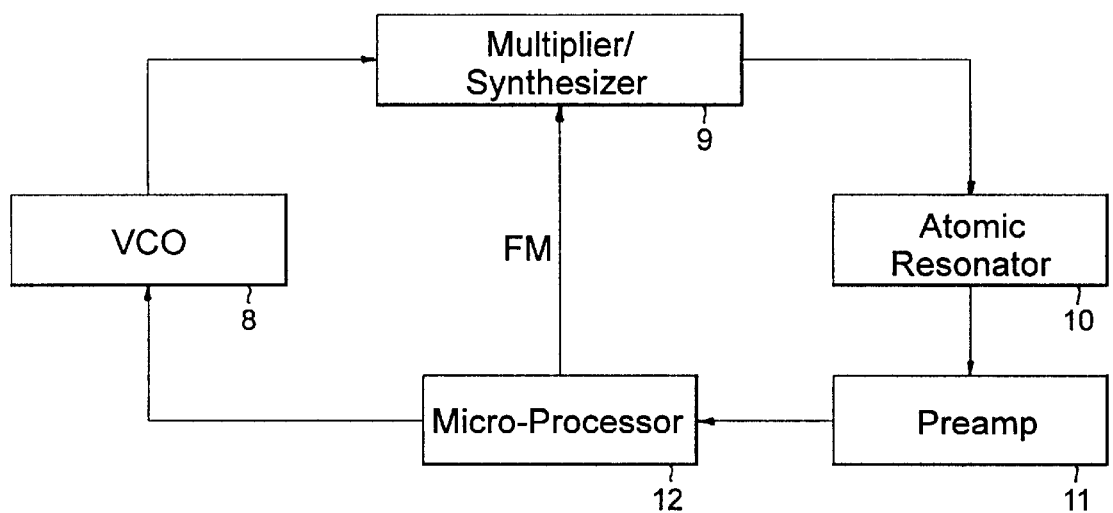
FIG. 2 is a block diagram illustration of a FLL Scheme according to a preferred embodiment of the invention.

The FLL Scheme according to a preferred embodiment of the invention is shown in FIG. 2. A microprocessor (12) is used in the loop and replaces the function of the modulator (7), demodulator (5) and the integrator (6). Item (8) is a Voltage Controlled Oscillator or VCO (same as (1)), item (9) is a Multiplier/Synthesizer (same as (2)), item (10) is the atomic resonator (same as (3)) and item (11) is a preamp (same as (4)).

The microprocessor, or an equivalent intelligent circuit, performs one or more of the following tasks:

1. The microprocessor (12) provides a modulation to the RF signal. The modulation is performed by using a frequency hopping method, i.e., the modulation frequency hops between two or more frequencies. The error signal from the Atomic Resonator is detected and demodulated by the microprocessor using an Analog to Digital Converter (ADC). The demodulation is performed by sampling the signal in synchronization and in phase to the modulation signal. The advantage of this method is to provide immunity to disturbances at the modulation frequency. For example, an external disturbance at the modulation frequency will have a much lesser effect when using this system. Similarly, the modulation and demodulation can be performed, based on Spread Spectrum Techniques.

2. The microprocessor (12) is used as a smart average or integrator of the error signal from the Atomic Resonator (10). The error signal is sampled by the microprocessor at an optimal rate, for example 100 Hz, and the samples are averaged and integrated according to a weight- sum average (similar to what is done with software clocks). Each sample is summed with a weight which is inversely proportional to its deviation from the average. This method improves the signal to noise ratio and as a result the purity and the cleanness of the RF output of the device. For example, if an external disturbance produces a long spike on the error signal, it will be almost completely ignored.

3. The microprocessor (12) controls the VCO (8). It retains the last voltage that controls the VCO (8) for the following purposes:
    a) When starting up the device, the control voltage to the VCO starts at the last retained value for ease of start and with no need for sweeping the voltage (in present devices the VCO frequency may drift in the course of time and as a result the control voltage may go out of the locking range—a method to solve this problem is to sweep the voltage to the VCO at start).
    b) When the Atomic resonator fails, the VCO continues to provide output frequency that matches the last correct locked frequency of the VCO, while the microprocessor provides a warning signal to the user. This is of great importance because it provides the user with an advanced warning, allowing time to handle the problem.

We claim:

1. An atomic frequency standard comprising a frequency lock loop circuit containing a microprocessor or equivalent intelligent circuit, adapted to modulate the RF input to an atomic resonator and to demodulate an error signal by means of frequency hopping or by a spread spectrum techniques.

2. A standard according to claim 1 where the microprocessor is adapted to sample averages and to integrate the error signal from the atomic resonator, utilizing a weighted average to improve the signal to noise ratio and to reject disturbances.

3. A method of operating a passive atomic frequency standard which standard comprises using a microprocessor as part of its frequency lock loop for modulating the RF signal introduced into the atomic resonator and demodulating an output signal from the atomic resonator by frequency hopping or by a spread spectrum technique.

4. A method according to claim 3, where an error signal is integrated by the microprocessor using a weighed sum technique, thus filtering out noise and improving the signal-to-noise ratio and rejecting disturbances.

5. A method according to claim 3 where the microprocesser produces a control voltage for a VCO and the last control voltage is saved in order to facilitate the start up of the device and in order to keep the VCO at the last frequency in case of atomic resonator failure.

* * * * *